(12) United States Patent
Mallik et al.

(10) Patent No.: US 9,391,013 B2
(45) Date of Patent: *Jul. 12, 2016

(54) 3D INTEGRATED CIRCUIT PACKAGE WITH WINDOW INTERPOSER

(71) Applicant: Intel Corporation, Santa Clara, CA (US)

(72) Inventors: Debendra Mallik, Chandler, AZ (US); Ram S. Viswanath, Phoenix, AZ (US); Sriram Srinivasan, Chandler, AZ (US); Mark T. Bohr, Aloha, OR (US); Andrew W. Yeoh, Portland, OR (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/813,014

(22) Filed: Jul. 29, 2015

(65) Prior Publication Data

US 2015/0332994 A1    Nov. 19, 2015

Related U.S. Application Data

(63) Continuation of application No. 13/995,917, filed as application No. PCT/US2011/066983 on Dec. 22, 2011, now Pat. No. 9,129,958.

(51) Int. Cl.
*H01L 23/48* (2006.01)
*H01L 23/498* (2006.01)
(Continued)

(52) U.S. Cl.
CPC .......... *H01L 23/49838* (2013.01); *H01L 23/13* (2013.01); *H01L 23/49816* (2013.01);
(Continued)

(58) Field of Classification Search
CPC ............... H01L 23/49838; H01L 23/49816; H01L 23/49833; H01L 23/49827; H01L 23/13; H01L 25/0652; H01L 25/0657
USPC .................................................. 257/774, 777
See application file for complete search history.

(56) References Cited

U.S. PATENT DOCUMENTS 6,906,415 B2    6/2005  Jiang et al.
2003/0209808 A1   11/2003 Baba
(Continued)

FOREIGN PATENT DOCUMENTS

CN    102217060    10/2011
JP    H11-177020    7/1999
(Continued)

OTHER PUBLICATIONS

Non-Final Office Action from U.S. Appl. No. 13/995,917 mailed Jun. 30, 2014, 15 pgs.
(Continued)

*Primary Examiner* — Nicholas Tobergte
(74) *Attorney, Agent, or Firm* — Blakely, Sokoloff, Taylor & Zafman LLP

(57) ABSTRACT

3D integrated circuit packages with window interposers and methods to form such semiconductor packages are described. For example, a semiconductor package includes a substrate. A top semiconductor die is disposed above the substrate. An interposer having a window is disposed between and interconnected to the substrate and the top semiconductor die. A bottom semiconductor die is disposed in the window of the interposer and interconnected to the top semiconductor die. In another example, a semiconductor package includes a substrate. A top semiconductor die is disposed above the substrate. An interposer is disposed between and interconnected to the substrate and the top semiconductor die. A bottom semiconductor die is disposed in a same plane as the interposer and interconnected to the top semiconductor die.

22 Claims, 10 Drawing Sheets

(51) Int. Cl.
  *H01L 23/13* (2006.01)
  *H01L 25/065* (2006.01)
(52) U.S. Cl.
  CPC .... *H01L23/49827* (2013.01); *H01L 23/49833* (2013.01); *H01L 25/0652* (2013.01); *H01L 25/0657* (2013.01); *H01L 2224/1403* (2013.01); *H01L 2224/14181* (2013.01); *H01L 2224/16145* (2013.01); *H01L 2224/16225* (2013.01); *H01L 2225/06513* (2013.01); *H01L 2225/06517* (2013.01); *H01L 2225/06544* (2013.01); *H01L 2225/06555* (2013.01); *H01L 2225/06562* (2013.01); *H01L 2924/1461* (2013.01); *H01L 2924/15151* (2013.01); *H01L 2924/15311* (2013.01)

(56) References Cited

U.S. PATENT DOCUMENTS

| 2011/0024888 | A1  | 2/2011 | Pagaila et al. |
| 2011/0068459 | A1* | 3/2011 | Pagaila ............ H01L 21/56 257/698 |
| 2012/0104623 | A1  | 5/2012 | Pagaila et al. |

FOREIGN PATENT DOCUMENTS

| JP | 2000156460  | 6/2000  |
| JP | 2003324183  | 11/2003 |
| JP | 200544989   | 2/2005  |
| WO | WO2010151350 | 12/2010 |

OTHER PUBLICATIONS

International Preliminary Report on Patentability from PCT/US2011/066983 mailed Jul. 3, 2014, 8 pgs.
Non-Final Office Action and Search Report for Taiwanese Patent Application No. 101147493, mailed Dec. 31, 2014, 7pgs.
Notice of Preliminary Rejection from Korean Patent Application No. 2014-7016940 mailed Jun. 12, 2015, 6 pgs.
Non-Final Office Action from Japanese Patent Application No. 2014-548771 mailed Nov. 4, 2015, 4 pgs.
Non-Final Office Action from U.S. Patent Application No. 2014-7016940 mailed Nov. 10, 2015, 2 pgs.
Final Office Action from U.S. Appl. No. 13/995,917 mailed Dec. 11, 2014, 16 pgs.
International Search Report and Written Opinion for PCT Patent Application No. PCT/US2011/066983 Mailed Sep. 26, 2012, 11 Pages.
Banijamali, Bahareh , et al., "Advanced Reliability Study of TSV Interposers and Interconnects for the 28nm Technology FPGA", 2011 Electronic Components and Technology Conference, 6 Pages.
Kim, Namhoon , et al., "Interposer Design Optimization for High Frequency Signal Transmission", 2011 Electronic Components and Technology Conference, 8 Pages.
Notice of First Office Action from Chinese Patent Application No. 201180075817.X mailed Mar. 31, 2016, 15 pgs.
Final Notice of Reasons for Rejection Japanese Patent Application No. 2014-548771 mailed May 10, 2016, 3 pgs.

* cited by examiner

3D INTEGRATED CIRCUIT PACKAGE WITH WINDOW INTERPOSER

CROSS-REFERENCE TO RELATED APPLICATIONS

This application is a continuation of U.S. patent application Ser. No. 13/995,917, filed on Jun. 19, 2013, which is a U.S. National Stage application under 35 U.S.C. §371 of International Application No. PCT/US2011/066983, filed on Dec. 22, 2011, the entire contents of which are hereby incorporated by reference herein.

TECHNICAL FIELD

Embodiments of the invention are in the field of semiconductor packages and, in particular, 3D integrated circuit packages with window interposers and methods to form such semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

On the other hand, conventional wire-bonding approaches may limit the number of semiconductor die that can reasonably be included in a single semiconductor package. Furthermore, general structural issues may arise when attempting to package a large number of semiconductor die in a semiconductor package.

Newer packaging approaches, such as through silicon via (TSV) and silicon interposer, are gaining much attention from designers for the realization of high performance Multi-Chip Module (MCM) and System in Package (SiP). However, additional improvements are needed in the evolution of semiconductor packages.

SUMMARY

Embodiments of the present invention include 3D integrated circuit packages with window interposers and methods to form such semiconductor packages.

In an embodiment, a semiconductor package includes a substrate. A top semiconductor die is disposed above the substrate. An interposer having a window is disposed between and interconnected to the substrate and the top semiconductor die. A bottom semiconductor die is disposed in the window of the interposer and interconnected to the top semiconductor die.

In another embodiment, a semiconductor package includes a substrate. A top semiconductor die is disposed above the substrate. An interposer is disposed between and interconnected to the substrate and the top semiconductor die. A bottom semiconductor die is disposed in a same plane as the interposer and interconnected to the top semiconductor die.

In another embodiment, a semiconductor die pairing includes a top semiconductor die. An interposer is disposed below and interconnected to the top semiconductor die. A bottom semiconductor die is disposed in a same plane as the interposer, and is interconnected to the top semiconductor die.

Figure 1A:
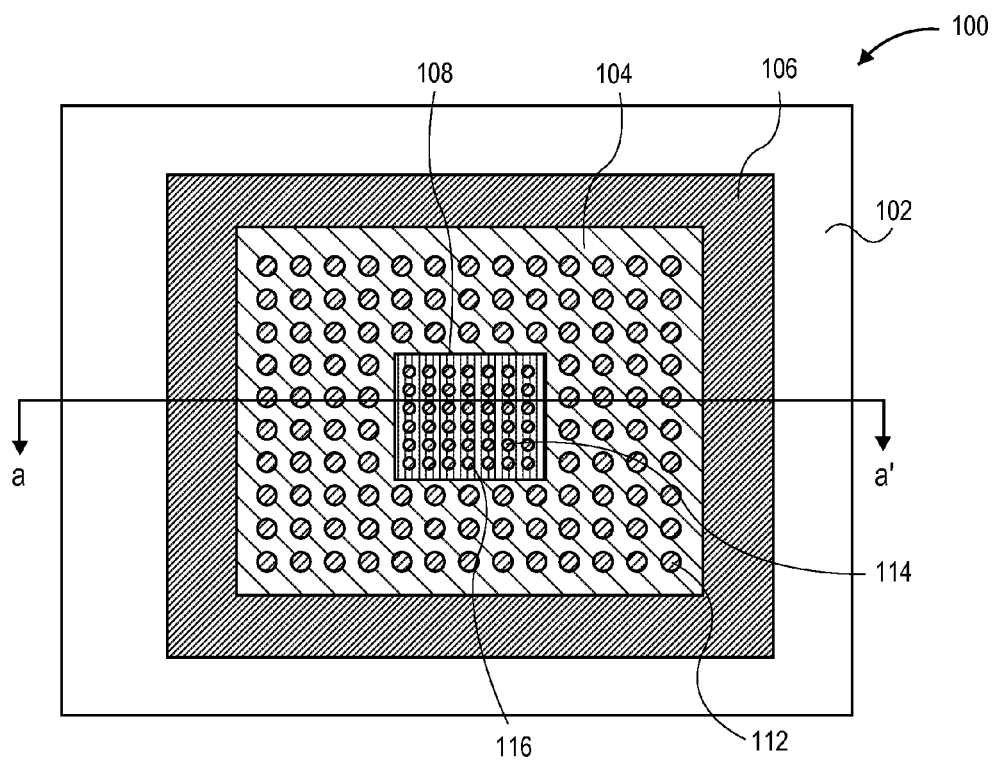
FIG. 1A illustrates a plan view of a 3D integrated circuit package with a window interposer, in accordance with an embodiment of the present invention.

DETAILED DESCRIPTION 3D integrated circuit packages with window interposers and methods to form such semiconductor packages are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted at incorporation of a window interposer for three-dimensional (3D) integrated circuit (IC) packaging. For example, a silicon interposer may be used for 3D stacking of CPU and memory as well as other devices. One or more embodiments are particularly useful for 10 nanometer node and beyond and beyond products. Some embodiments incorporate a silicon interposer for high density interconnect (e.g., reroute and fan out) formation. The silicon interposer may be processed in a manner similar to back end of line processing for interconnect layers on a semiconductor IC die.

A conventional silicon interposer typically occupies a full layer below an active die. Furthermore, conventional 3D stacked ICs typically require one or more through silicon vias (TSVs) formed through one of the active die. TSV through active die is expensive. Also, in a 3D stacked IC structure, a re-distribution layer (RDL) on the back of such a bottom active die is often required to manage placement of the TSV and die-die interconnect (e.g., the LMI pad). Long RDL interconnect lines may affect high speed I/O performance. Accordingly, one or more embodiments described herein enable 3D IC stacking without TSV in any of the active die. Also, in an embodiment, a silicon interposer is include and at least one of active die layers share a same vertical plane with the interposer, saving Z height.

In an embodiment, a silicon interposer is included under a top active die (T) and provides a window under the top die so that a bottom active die (B) can be directly stacked below the top die. The bottom active die and the interposer reside on the same vertical level in the 3D stack structure. In one such embodiment, 3D IC stacking of two active die is achieved without requiring TSV in either of the active die. The interposer is attached to the package substrate by a mid-level interconnect (MLI). The interposer includes the TSV which provide vertical electrical paths between the package substrate to the active die. In an embodiment, MLI bumps are further included on the bottom active die. Benefits of a silicon interposer, such as bump pitch transformation, passives integration, ILD protection, etc., may be maintained in the new architectures described herein. In an embodiment, the interposer material is silicon. However, glass, organic or ceramic may be used instead or as well.

Features described herein and pertaining to one or more embodiments include, but are not limited to, (a) a silicon interposer designed and assembled in a manner to provide a window beneath a top active die for direct stacking of bottom active die to top active die, (b) an interposer and a bottom active die reside on the same vertical level in a 3D stack, (c) 3D IC stacking achieved without requiring TSV in any of the active die, (d) TSV on bottom die is optional, and (e) permutations and combinations of (a)-(d).

Figure 1B:
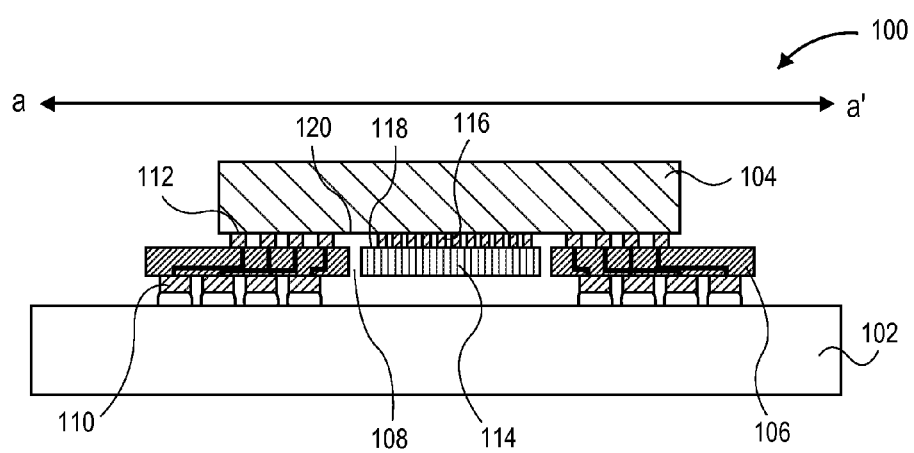
FIG. 1B illustrates a cross-sectional view of the 3D integrated circuit package with a window interposer of FIG. 1A, in accordance with an embodiment of the present invention.

As an example of general concepts covered herein, FIG. 1A illustrates a plan view of a 3D integrated circuit package with a window interposer, in accordance with an embodiment of the present invention. FIG. 1B illustrates a cross-sectional view of the 3D integrated circuit package with a window interposer of FIG. 1A, in accordance with an embodiment of the present invention.

Referring to FIGS. 1A and 1B, a semiconductor package 100 (or portion of a semiconductor package) includes a substrate 102. A top semiconductor die 104 is disposed above the substrate 102. An interposer 106 having a window 108 is disposed between and interconnected to the substrate 102 (e.g., by mid-level interconnects (MLI) 110) and the top semiconductor die 104 (e.g., by first level interconnects (FLI) 112). A bottom semiconductor die 114 is disposed in the window 108 of the interposer 106 and interconnected to the top semiconductor die 104 (e.g., by interconnects 116). The bottom semiconductor die 114 has no through silicon vias (TSVs) and is not interconnected directly to the substrate 102. Instead, an active side 118 of the bottom semiconductor die 114 faces an active side 120 of the top semiconductor die 104, and away from the substrate 102. In accordance with an embodiment of the present invention, the bottom semiconductor die 114 is disposed in a closed window 108 of the interposer 106, in that the window 106 completely surrounds the bottom die 114, as depicted in FIG. 1A. In an embodiment, the top semiconductor die 104 completely overlaps the bottom semiconductor die 114, as is also depicted in FIG. 1A. Thus, in an embodiment, a 3D package includes no TSV in an active die and involves a face-to-face arrangement of the top and bottom die.

In an embodiment, window interposer 106 is composed of silicon. However, other embodiments include a window interposer composed of materials such as, but not limited to glass, ceramic, or organic materials. In an embodiment, the window interposer 106 may or may not include passive devices. In an embodiment, the window interposer 106 has high density interconnects, through silicon vias (TSVs) and fin pitch micro-bumps.

In an embodiment, the bottom active die 114 represents an unstacked (single chip) or stacked (multiple chip) arrangement. In an embodiment, the bottom die 114 is an analogue or memory device. In an embodiment, the top active die 104 represents a single chip or side by side (e.g., multi chip package (MCP)) arrangement, the latter described in greater detail below in association with FIGS. 6A and 6B. In an embodiment, the top active die 104 is of full thickness or is thinned (or includes stacked die). In an embodiment, the top die 104 is a CPU or memory device.

Conventional 3D stacked IC architectures typically require TSV through at least one of the active die. TSV through active die is expensive, at least in part due to the costs associated with creating the TSVs themselves. Furthermore, costly die area may be consumed by the TSV plus the TSV keep out zone. Accordingly, at least some of the embodiments herein provide a TSV-free approach to 3D packaging.

In an embodiment, the top semiconductor die 104 is configured to provide power to the bottom semiconductor die 114. In an embodiment, the top semiconductor die 104 is configured to facilitate communication between the bottom semiconductor die 114 and the substrate 102, e.g., through routing in the substrate 102. In an embodiment, the bottom semiconductor die 104 has no through silicon vias (TSVs). Thus, connection between the bottom die 114 and substrate 102 is achieved indirectly through interconnect lines on the top die 104 as well as the interposer 106. Thus, in reference to FIG. 1A, for a 3D IC, bottom and top active die are stacked face-to-face. It is to be understood, however, that, in an alternative embodiment, a bottom die may be connected directly by using TSV on the bottom die, as described in greater details below in association with FIG. 2.

One or both of the semiconductor die 104 or 114 may be formed from a semiconductor substrate, such as a single crystalline silicon substrate. Other materials, such as, but not limited to, group III-V material and germanium or silicon germanium material substrates may also be considered. The active side (120 or 118, respectively) of the semiconductor die 104 or 114 may be the side upon which semiconductor devices are formed. In an embodiment, the active side 120 or 118 of the semiconductor die 104 or 114, respectively, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

Stacked die apparatus 100 may be particularly suitable for packaging a memory die with a logic die. For example, in an embodiment, one of die 104 or 114 is a memory die. The other die is a logic die. In an embodiment of the present invention, the memory die is a memory device, such as but not limited to a static random access memory (SRAM), a dynamic access memory (DRAM), a nonvolatile memory (NVM) and the logic die is a logic device, such as but not limited to a microprocessor and a digital signal processor.

In accordance with an embodiment of the present invention, one or more of die interconnect structures 112 or 116 or interposer 106 to substrate 102 interconnect structures 110 is composed of an array of metal bumps. In one embodiment, each metal bump is composed of a metal such as, but not limited to, copper, gold, or nickel. Substrate 102 may be a flexible substrate or a rigid substrate, depending upon the specific application. In an embodiment, substrate 102 has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA). In an embodiment, the solder balls are used and are composed of lead or are lead free, such as alloys of gold and tin solder or silver and tin solder.

Figure 2:
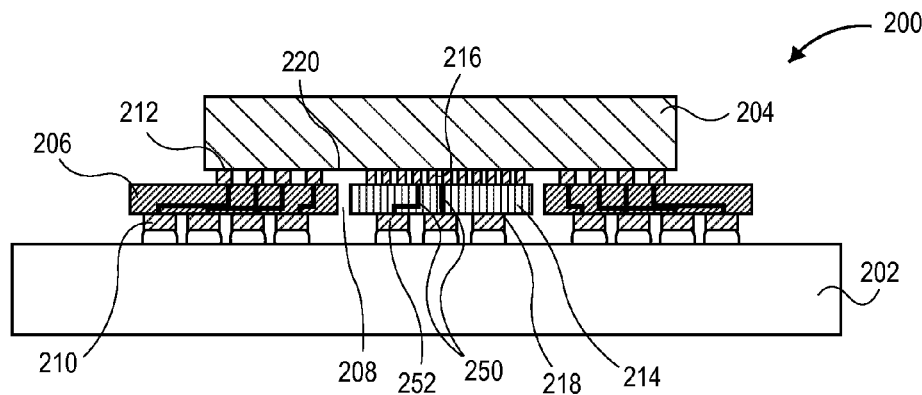
FIG. 2 illustrates a cross-sectional view of another 3D integrated circuit package with a window interposer, in accordance with another embodiment of the present invention.

As another example of general concepts covered herein, FIG. 2 illustrates a cross-sectional view of another 3D integrated circuit package with a window interposer, in accordance with another embodiment of the present invention.

Referring to FIG. 2, a semiconductor package 200 (or portion of a semiconductor package) includes a substrate 202. A top semiconductor die 204 is disposed above the substrate 202. An interposer 206 having a window 208 is disposed between and interconnected to the substrate 202 (e.g., by mid-level interconnects (MLI) 210) and the top semiconductor die 204 (e.g., by first level interconnects (FLI) 212). A bottom semiconductor die 214 is disposed in the window 208 of the interposer 206 and interconnected to the top semiconductor die 204 (e.g., by interconnects 216). The bottom semiconductor die 214 has through silicon vias (TSVs) 250 and is interconnected directly to the substrate 202, e.g., by interconnects 252. As such, an active side 218 of the bottom semiconductor die 214 faces away from an active side 220 of the top semiconductor die 204, and toward the substrate 202. In accordance with an embodiment of the present invention, the bottom semiconductor die 214 is disposed in a closed window 208 of the interposer 206, in that the window 206 completely surrounds the bottom die 214. In an embodiment, the top semiconductor die 204 completely overlaps the bottom semiconductor die 214. Thus, in an embodiment, a 3D package includes a bottom die with TSV and MLI and a face to back orientation with respect to a top die. The characteristics and configurations of the packaged die and the materials of package 200 may be the same or similar to those described above for package 100.

Figure 3A:
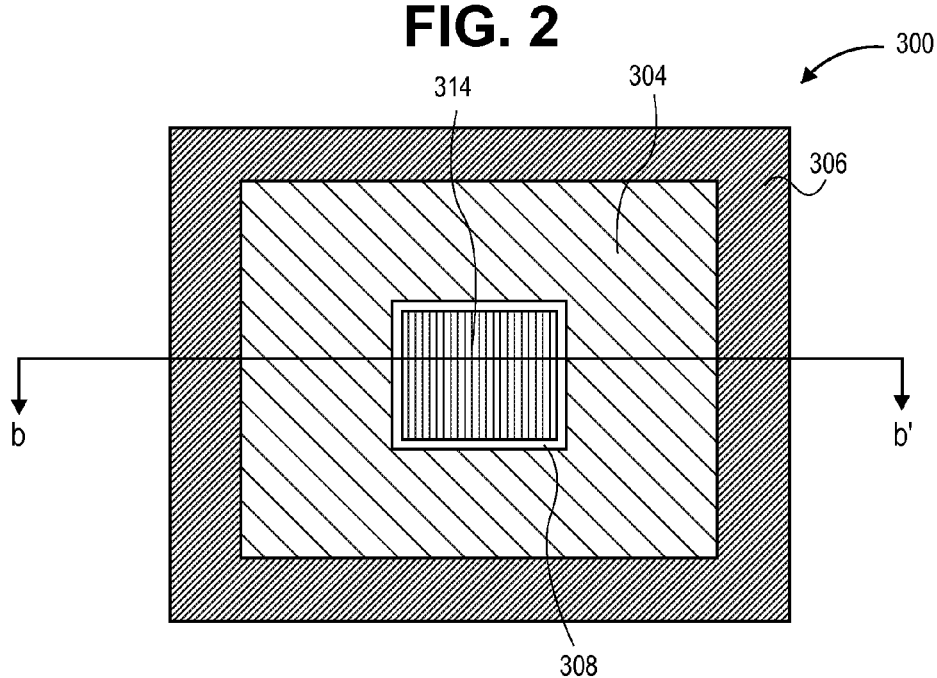
FIGS. 3A and 3B illustrate a plan view and a cross-sectional view, respectively, of a semiconductor die pairing, in accordance with an embodiment of the present invention.

Overall, in an embodiment, referring again to FIGS. 1A, 1B and 2, a window-interposer is included in a 3D stacked IC package. The interposer provides a window under a top active die for 3D stacking of top and bottom active die. FIGS. 3A/3B, 4A/B, 5A/B, 6A/B, 7A/B and 8A/B illustrate various embodiments of stacked IC top and bottom die pairings with window interposers. The pairings may ultimately be packaged on a substrate, as described in greater detail below in association with FIG. 9.

Figure 3B:
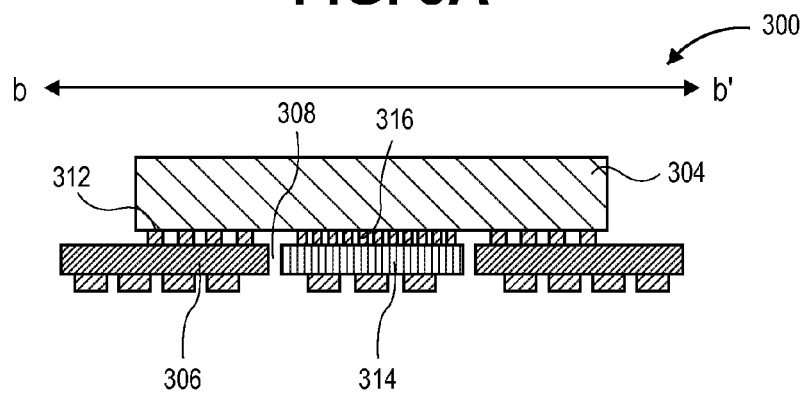

In a first example, an interposer with a single closed window (e.g., a completely surrounding window) is included. FIGS. 3A and 3B illustrate a plan view and a cross-sectional view, respectively, of a semiconductor die pairing, in accordance with an embodiment of the present invention.

Referring to FIGS. 3A and 3B, a semiconductor die pairing 300 includes a top semiconductor die 304. An interposer 306 is disposed below and interconnected to the top semiconductor die 304 (e.g., by first level interconnects (FLI) 312). A bottom semiconductor die 314 is disposed in a same plane as the interposer 306, and is interconnected to the top semiconductor die 304 (e.g., by interconnects 316). The bottom semiconductor die 314 is disposed in a closed window 308 of the interposer 306. In an embodiment, the top semiconductor die 304 completely overlaps the bottom semiconductor die 314, as depicted in FIG. 3A. The characteristics and configurations of the die and the materials of die pairing 300 may be the same or similar to those described above for the die pairings of packages 100 or 200.

Figure 4A:
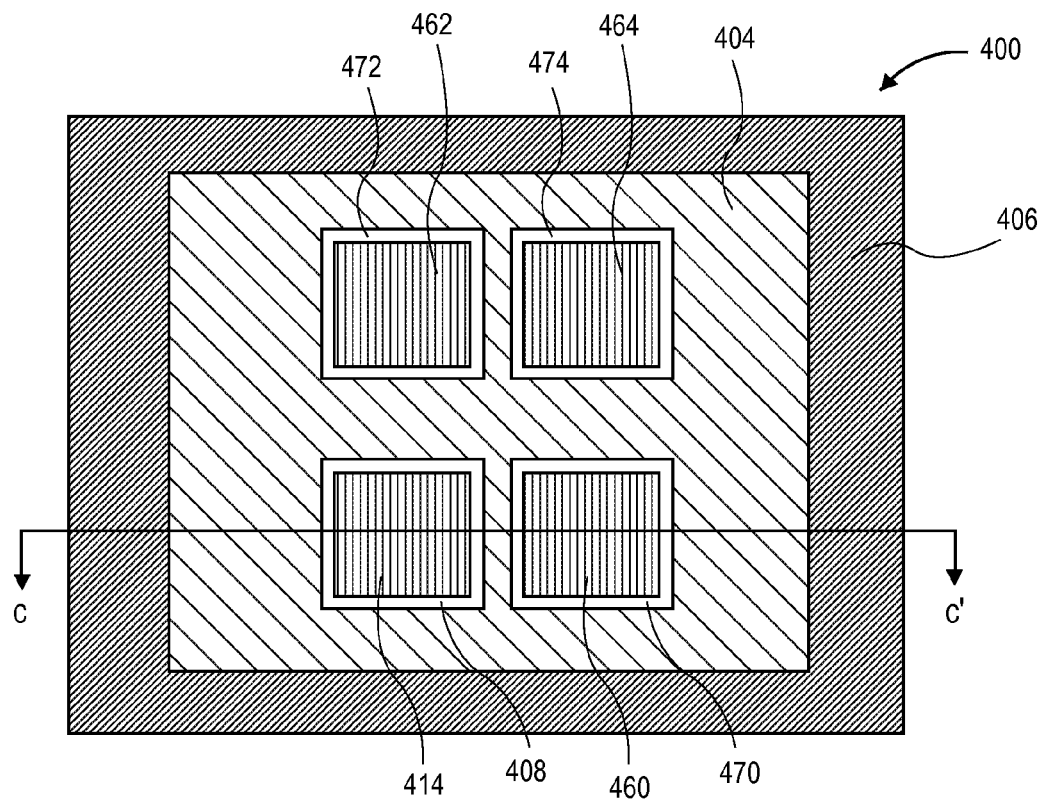
FIGS. 4A and 4B illustrate a plan view and a cross-sectional view, respectively, of another semiconductor die pairing, in accordance with another embodiment of the present invention.
Figure 4B:
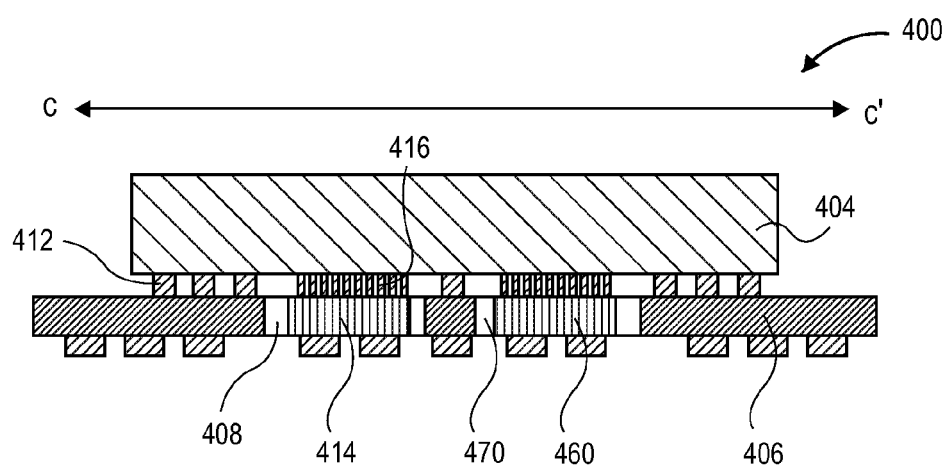

In a second example, an interposer with multiple closed windows (e.g., completely surrounding windows) is included. FIGS. 4A and 4B illustrate a plan view and a cross-sectional view, respectively, of another semiconductor die pairing, in accordance with another embodiment of the present invention.

Referring to FIGS. 4A and 4B, a semiconductor die pairing 400 includes a top semiconductor die 404. An interposer 406 is disposed below and interconnected to the top semiconductor die 404 (e.g., by first level interconnects (FLI) 412). Four bottom semiconductor die 414, 460, 462 and 464 are disposed in a same plane as the interposer 406, and are interconnected to the top semiconductor die 404 (e.g., by interconnects 416). The bottom semiconductor die 414, 460, 462 and 464 are each disposed in a respective closed window 408, 470, 472 and 474 of the interposer 406. In an embodiment, the top semiconductor die 404 completely overlaps the bottom semiconductor die 414, 460, 462 and 464, as depicted in FIG. 4A. The characteristics and configurations of the die and the materials of die pairing 400 may be the same or similar to those described above for the die pairings of packages 100 or 200.

Figure 5A:
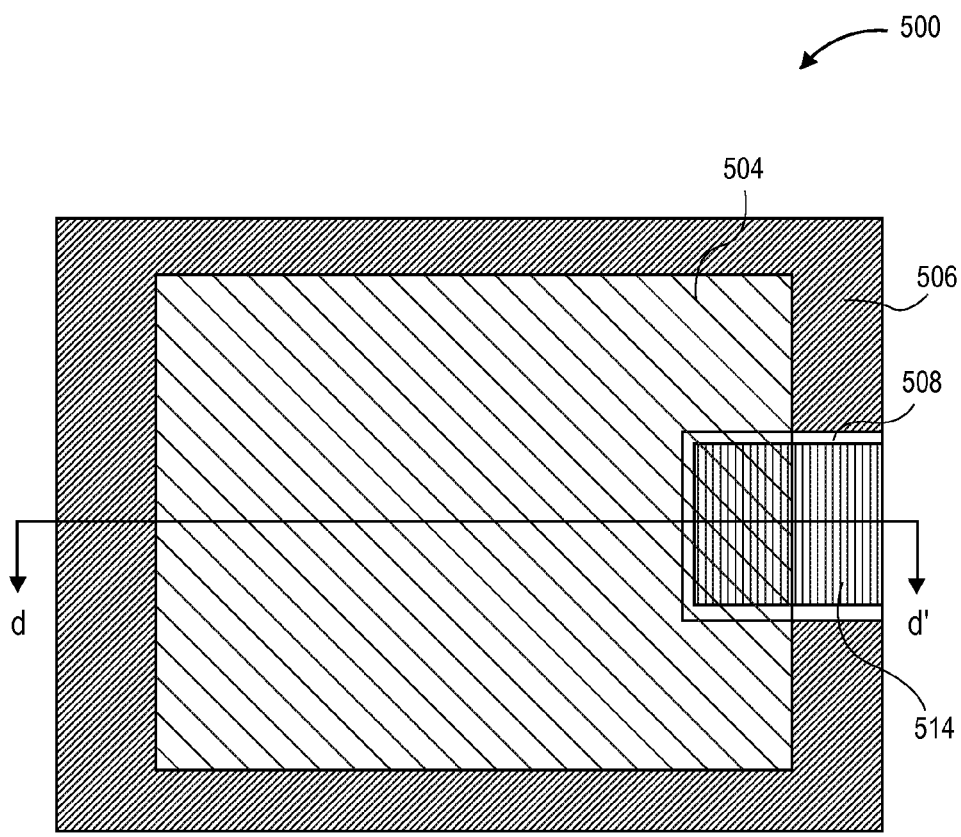
FIGS. 5A and 5B illustrate a plan view and a cross-sectional view, respectively, of another semiconductor die pairing, in accordance with another embodiment of the present invention.
Figure 5B:
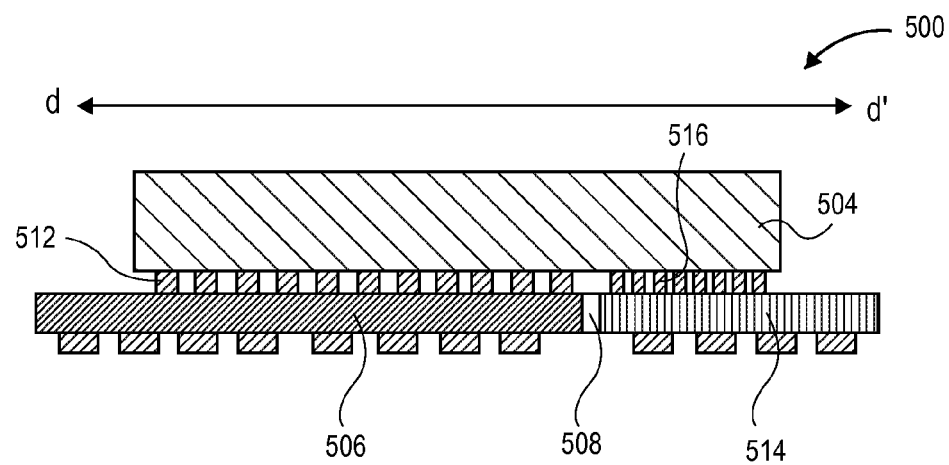

In a third example, an interposer with an open window (e.g., an only partially surrounding window) is included. FIGS. 5A and 5B illustrate a plan view and a cross-sectional view, respectively, of another semiconductor die pairing, in accordance with another embodiment of the present invention.

Referring to FIGS. 5A and 5B, a semiconductor die pairing 500 includes a top semiconductor die 504. An interposer 506 is disposed below and interconnected to the top semiconductor die 504 (e.g., by first level interconnects (FLI) 512). A bottom semiconductor die 514 is disposed in a same plane as the interposer 506, and is interconnected to the top semiconductor die 504 (e.g., by interconnects 516). The bottom semiconductor die 514 is disposed in an open window 508 of the interposer 506. In an embodiment, the top semiconductor die 504 only partially overlaps the bottom semiconductor die 514, as depicted in FIG. 5A. In an embodiment (not shown), the bottom die is larger than the top die. The characteristics and configurations of the die and the materials of die pairing 500 may be the same or similar to those described above for the die pairings of packages 100 or 200.

Figure 6A:
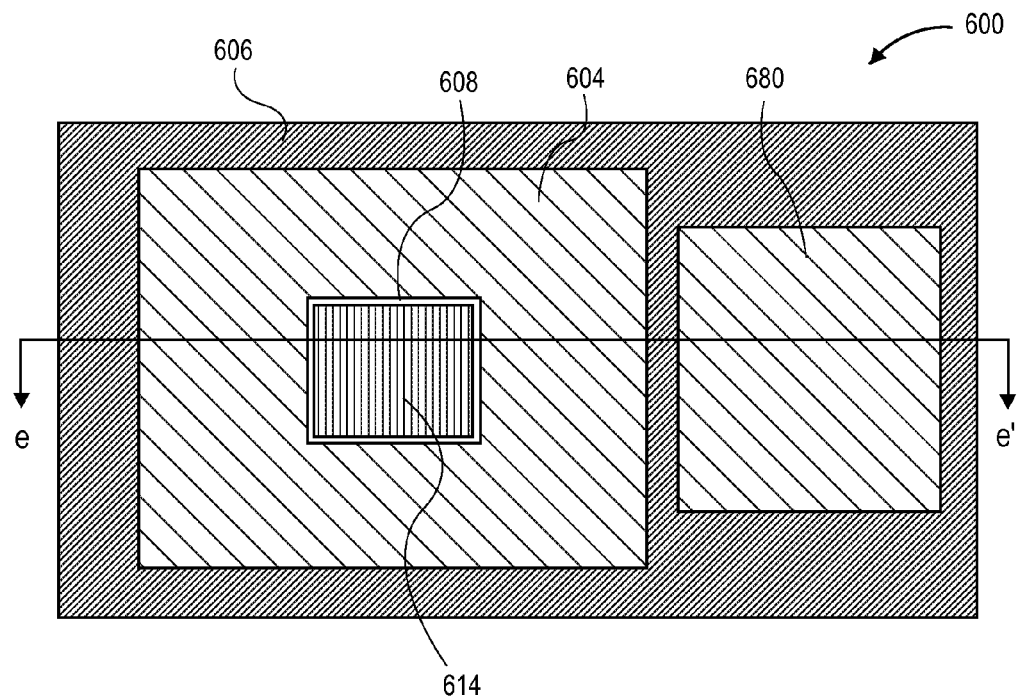
FIGS. 6A and 6B illustrate a plan view and a cross-sectional view, respectively, of another semiconductor die pairing, in accordance with another embodiment of the present invention.
Figure 6B:
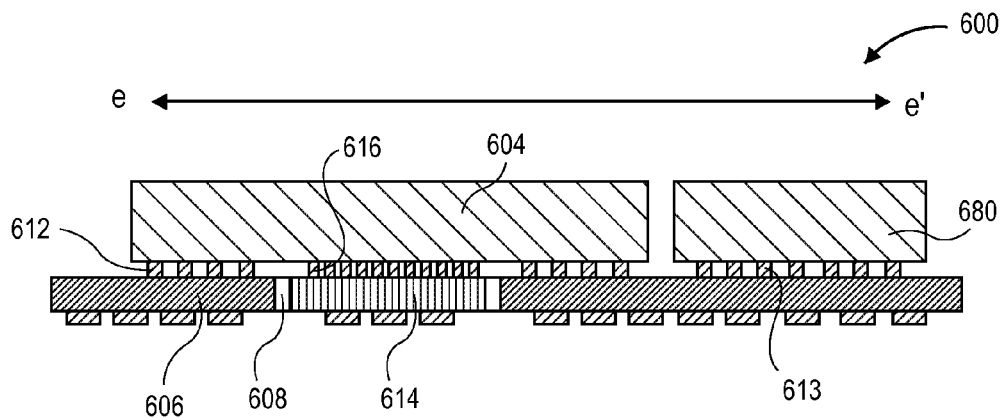

In a fourth example, multiple top die are included in a pairing having a window interposer. FIGS. 6A and 6B illustrate a plan view and a cross-sectional view, respectively, of another semiconductor die pairing, in accordance with another embodiment of the present invention.

Referring to FIGS. 6A and 6B, a semiconductor die pairing 600 includes a top semiconductor die 604. An interposer 606 is disposed below and interconnected to the top semiconductor die 604 (e.g., by first level interconnects (FLI) 612). A bottom semiconductor die 614 is disposed in a same plane as the interposer 606, and is interconnected to the top semiconductor die 604 (e.g., by interconnects 616). The bottom semiconductor die 614 is disposed in a closed window 608 of the interposer 606. One or more additional top semiconductor die 680 is included and disposed in a same plane as the top semiconductor die 604, and interconnected to the interposer (e.g., by first level interconnects (FLI) 613). In an embodiment, the top semiconductor die 604 completely overlaps the bottom semiconductor die 614, as depicted in FIG. 6A. The characteristics and configurations of the die and the materials of die pairing 600 may be the same or similar to those described above for the die pairings of packages 100 or 200.

Figure 7A:
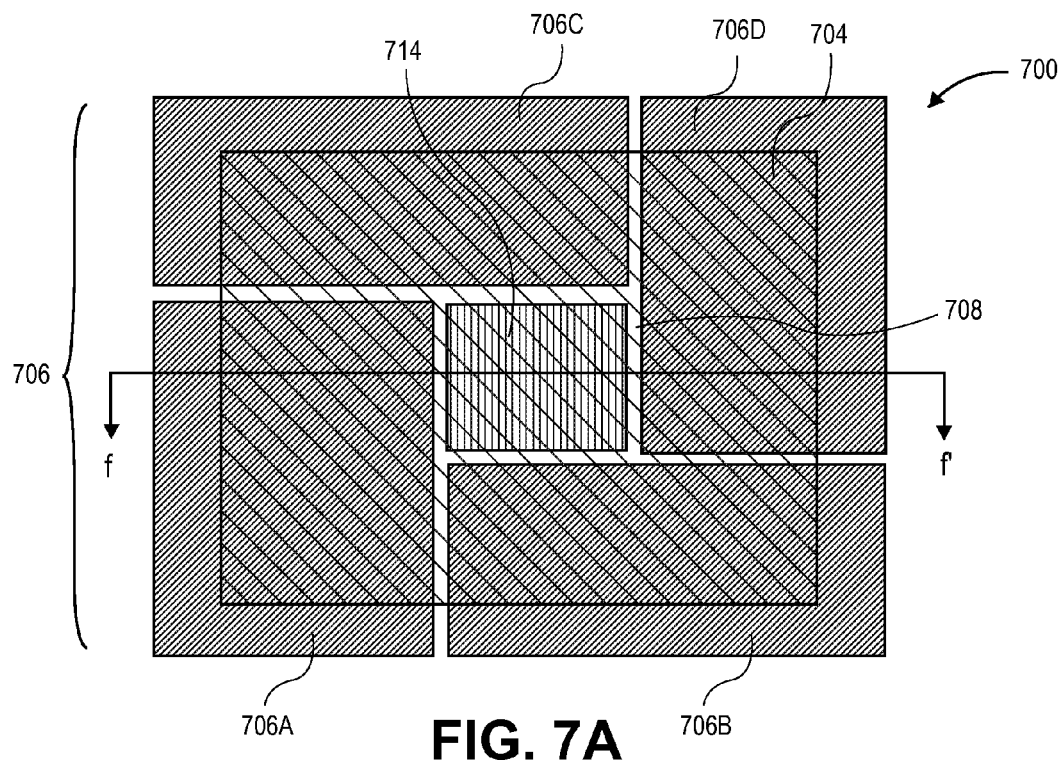
FIGS. 7A and 7B illustrate a plan view and a cross-sectional view, respectively, of another semiconductor die pairing, in accordance with another embodiment of the present invention.
Figure 7B:
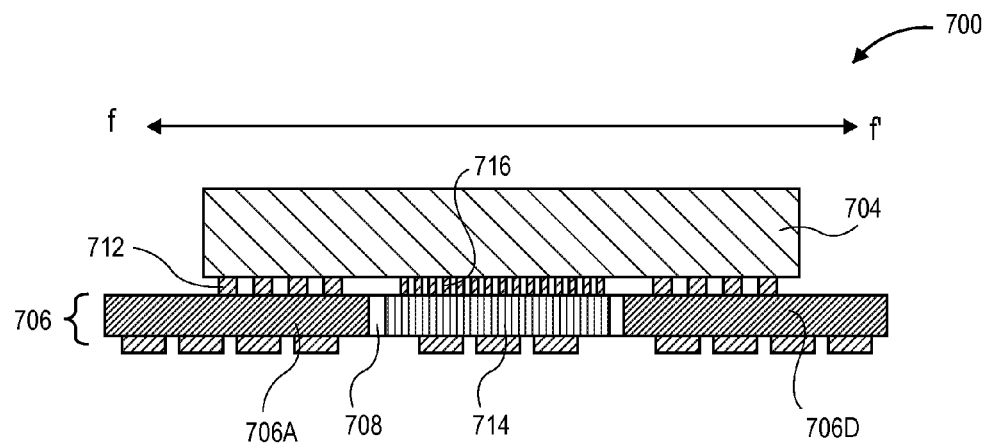

In a fifth example, a multiple-component interposer with a closed window (e.g., a completely surrounding window) is included. FIGS. 7A and 7B illustrate a plan view and a cross-sectional view, respectively, of another semiconductor die pairing, in accordance with another embodiment of the present invention.

Referring to FIGS. 7A and 7B, a semiconductor die pairing 700 includes a top semiconductor die 704. An interposer 706 is disposed below and interconnected to the top semiconductor die 704 (e.g., by first level interconnects (FLI) 712). The interposer 706 is composed of two or more discrete units (in this case, the four discrete units 706A, 706B, 706C, and 707D). A bottom semiconductor die 714 is disposed in a same plane as the interposer 706, and is interconnected to the top semiconductor die 704 (e.g., by interconnects 716). The bottom semiconductor die 714 is disposed in a closed window 708 of the interposer 706. Specifically, the bottom semiconductor die 714 is disposed in a closed window 708 of the two or more discrete units (in this case, the four discrete units 706A, 706B, 706C, and 707D) of the interposer 706. In an embodiment, the top semiconductor die 704 completely overlaps the bottom semiconductor die 714, as depicted in FIG. 7A. The characteristics and configurations of the die and the materials of die pairing 700 may be the same or similar to those described above for the die pairings of packages 100 or 200.

Figure 8A:
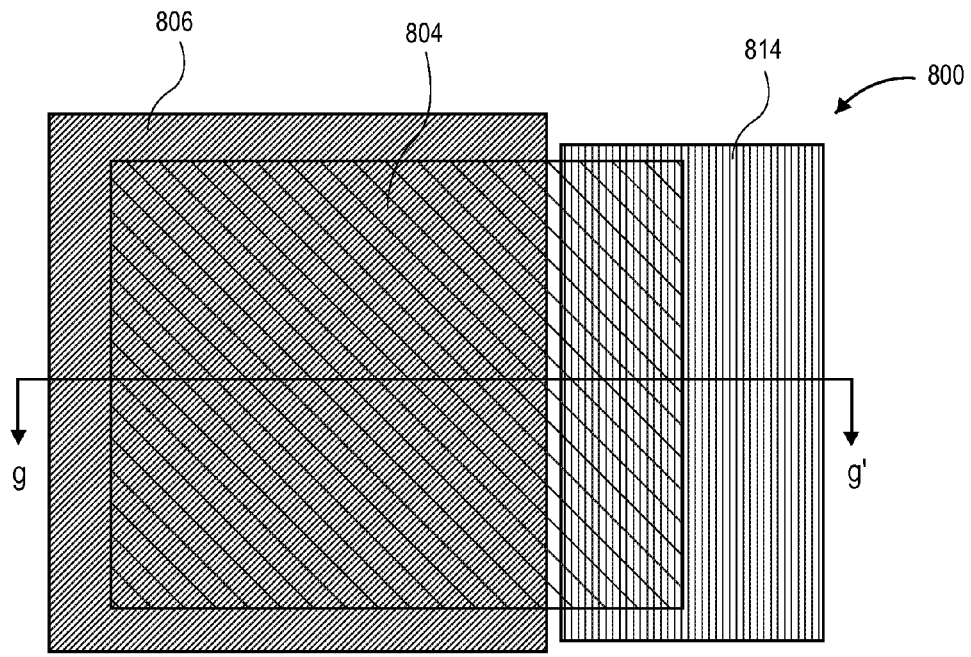
FIGS. 8A and 8B illustrate a plan view and a cross-sectional view, respectively, of another semiconductor die pairing, in accordance with another embodiment of the present invention.
Figure 8B:
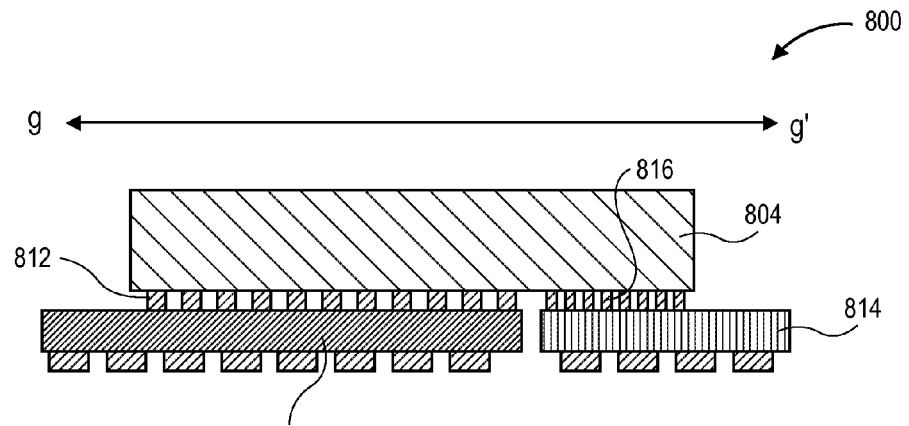

In a sixth example, a bottom die is included side by side, in the same plane, with an interposer. FIGS. 8A and 8B illustrate a plan view and a cross-sectional view, respectively, of another semiconductor die pairing, in accordance with another embodiment of the present invention.

Referring to FIGS. 8A and 8B, a semiconductor die pairing 800 includes a top semiconductor die 804. An interposer 806 is disposed below and interconnected to the top semiconductor die 804 (e.g., by first level interconnects (FLI) 812). A bottom semiconductor die 814 is disposed in a same plane as the interposer 806, and is interconnected to the top semiconductor die 804 (e.g., by interconnects 816). The bottom semiconductor die 814 is disposed adjacent to, but not within, the interposer 806. In an embodiment, the top semiconductor die 804 only partially overlaps the bottom semiconductor die 814, as depicted in FIGS. 8A and 8B. The characteristics and configurations of the die and the materials of die pairing 800 may be the same or similar to those described above for the die pairings of packages 100 or 200.

Referring again to FIGS. 3A/3B, 4A/B, 5A/B, 6A/B, 7A/B and 8A/B, in an embodiment, the respective bottom semiconductor die of each pairing has no through silicon vias (TSVs). In an embodiment, an active side of the bottom semiconductor die faces an active side of the top semiconductor die. In another embodiment, the respective bottom semiconductor die of each pairing has through silicon vias (TSVs). In an embodiment, an active side of the bottom semiconductor die faces away from an active side of the top semiconductor die. It is to be understood that various permutations and combinations of the die pairings described in association with FIGS. 3A/3B, 4A/B, 5A/B, 6A/B, 7A/B and 8A/B may also be considered. For example, in an embodiment, combinations of the features of die pairings 400 and 500, or 400 and 600, or 400, 500 and 600, or 800 and 400, or other such combinations may be fabricated.

In another aspect, methods for fabricating 3D integrated circuit packages with window interposers are provided herein. In a first example, FIG. 9 illustrates a process flow 900 for a method of fabricating a 3D integrated circuit package with a window interposer, in accordance with an embodiment of the present invention.

Figure 9:
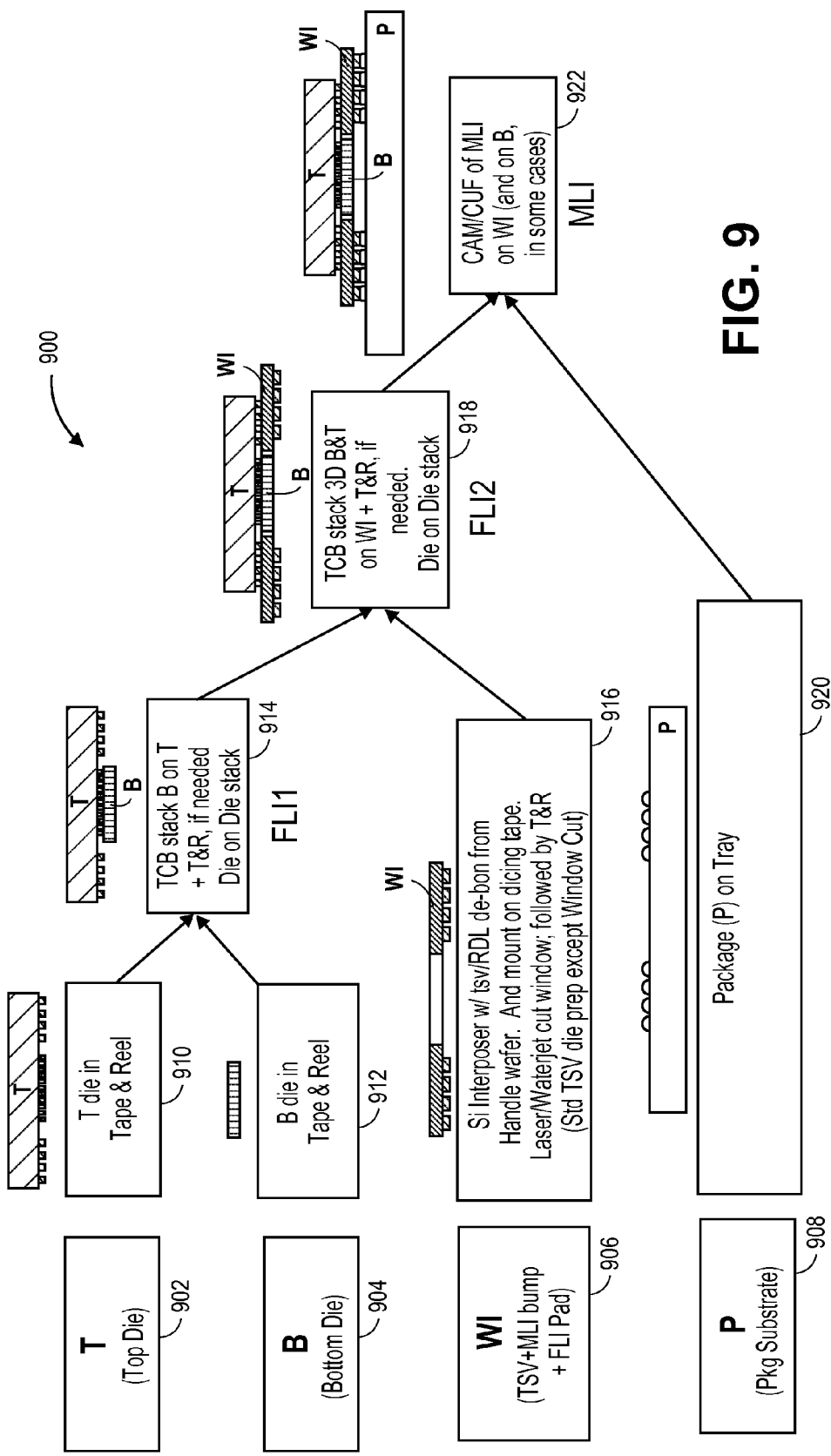
FIG. 9 illustrates a process flow for a method of fabricating a 3D integrated circuit package with a window interposer, in accordance with an embodiment of the present invention.

Referring to process flow 900 of FIG. 9, a top die 902 portion of the flow includes providing a top die in a tape and reel format 910. A bottom die 904 portion of the flow includes providing a bottom die in a tape and reel format 912. Thermal compression bonding (TCB) is then used to stack the bottom die on the top die 914. A window interposer 906 portion of the flow may include providing an interposer with a window and, possibly with TSVs, mid-level interconnect (MLI) bumps and first level interconnect (FLI) pads. In 916, an interposer (such as a silicon interposer) with TSV and re-distribution layer (RDL) is de-bonded from a handling wafer and mounted on dicing tape. Laser and/or water jet cutting may be used to provide a window. In 918, the stack from 914 is bonded (e.g., by TCB) with the interposer. A package substrate 908 portion of flow includes providing a package substrate, e.g., on a tray as in 920. In 922, by CAM and/or copper underfill (CUF) of mid-level interconnects (MLI) on the window interposer is used to couple the die pairing with the window interposer on a package substrate. Thus, referring again to process flow 900, FLI is formed first by 3D stacking of bottom die, top die, and window interposer first, then MLI is used to attach the pairing to a package substrate. It is to be understood that the bottom die may or may not have MLI bumps. Additionally, the window interposer may be composed of multiple pieces. Also, additional die may be included in the pairing.

Thus, a die pairing including an interposer may be fabricated as a portion of a packaging process. Any of a variety of multiple die pairings including an interposer may then be coupled to a package substrate, as described in association with FIG. 9. Accordingly, in an embodiment, a semiconductor package includes a substrate. A top semiconductor die is disposed above the substrate. An interposer having a window is disposed between and interconnected to the substrate and the top semiconductor die. A bottom semiconductor die is disposed in the window of the interposer and interconnected to the top semiconductor die.

In one such embodiment, the bottom semiconductor die is disposed in a closed window of the interposer, as described in association with FIGS. 3A and 3B. In a specific such embodiment, the top semiconductor die completely overlaps the bottom semiconductor die, as is also described in association with FIGS. 3A and 3B.

In another such embodiment, one or more additional bottom semiconductor die is included. The one or more additional bottom semiconductor die is disposed in one or more additional closed windows of the interposer, as described in association with FIGS. 4A and 4B. In a specific such embodiment, the top semiconductor die completely overlaps the bottom semiconductor die as well as the one or more additional bottom semiconductor die, as is also described in association with FIGS. 4A and 4B.

In another such embodiment, the bottom semiconductor die is disposed in an open window of the interposer, as described in association with FIGS. 5A and 5B. In a specific such embodiment, the top semiconductor die only partially overlaps the bottom semiconductor die, as is also described in association with FIGS. 5A and 5B.

In another such embodiment, one or more additional top semiconductor die is included. The one or more additional top semiconductor die is disposed above the substrate in a same plane as the top semiconductor die and is interconnected to the interposer, as described in association with FIGS. 6A and 6B. In a specific such embodiment, the top semiconductor die completely overlaps the bottom semiconductor die, as is also described in association with FIGS. 6A and 6B.

In another such embodiment, the interposer is composed of two or more discrete units. The bottom semiconductor die is disposed in a closed window of the two or more discrete units of the interposer, as described in association with FIGS. 7A and 7B. In a specific such embodiment, the top semiconductor die completely overlaps the bottom semiconductor die, as is also described in association with FIGS. 7A and 7B.

In another embodiment, a semiconductor package includes a substrate. A top semiconductor die is disposed above the substrate. An interposer is disposed between and interconnected to the substrate and the top semiconductor die. A bottom semiconductor die is disposed in a same plane as the interposer and interconnected to the top semiconductor die. In one such embodiment, the bottom semiconductor die is disposed adjacent to, but not within, the interposer, as described in association with FIGS. 8A and 8B. In a specific such embodiment, the top semiconductor die only partially overlaps the bottom semiconductor die, as is also described in association with FIGS. 8A and 8B.

In reference again to the above variety of die pairings, in an embodiment, the bottom semiconductor die has no through silicon vias (TSVs) and is not interconnected directly to the substrate. In an embodiment, an active side of the bottom semiconductor die faces an active side of the top semiconductor die, and away from the substrate. In another embodiment, the bottom semiconductor die has through silicon vias (TSVs) and is interconnected directly to the substrate. In an embodiment, an active side of the bottom semiconductor die faces away from an active side of the top semiconductor die, and toward the substrate.

Figure 10:
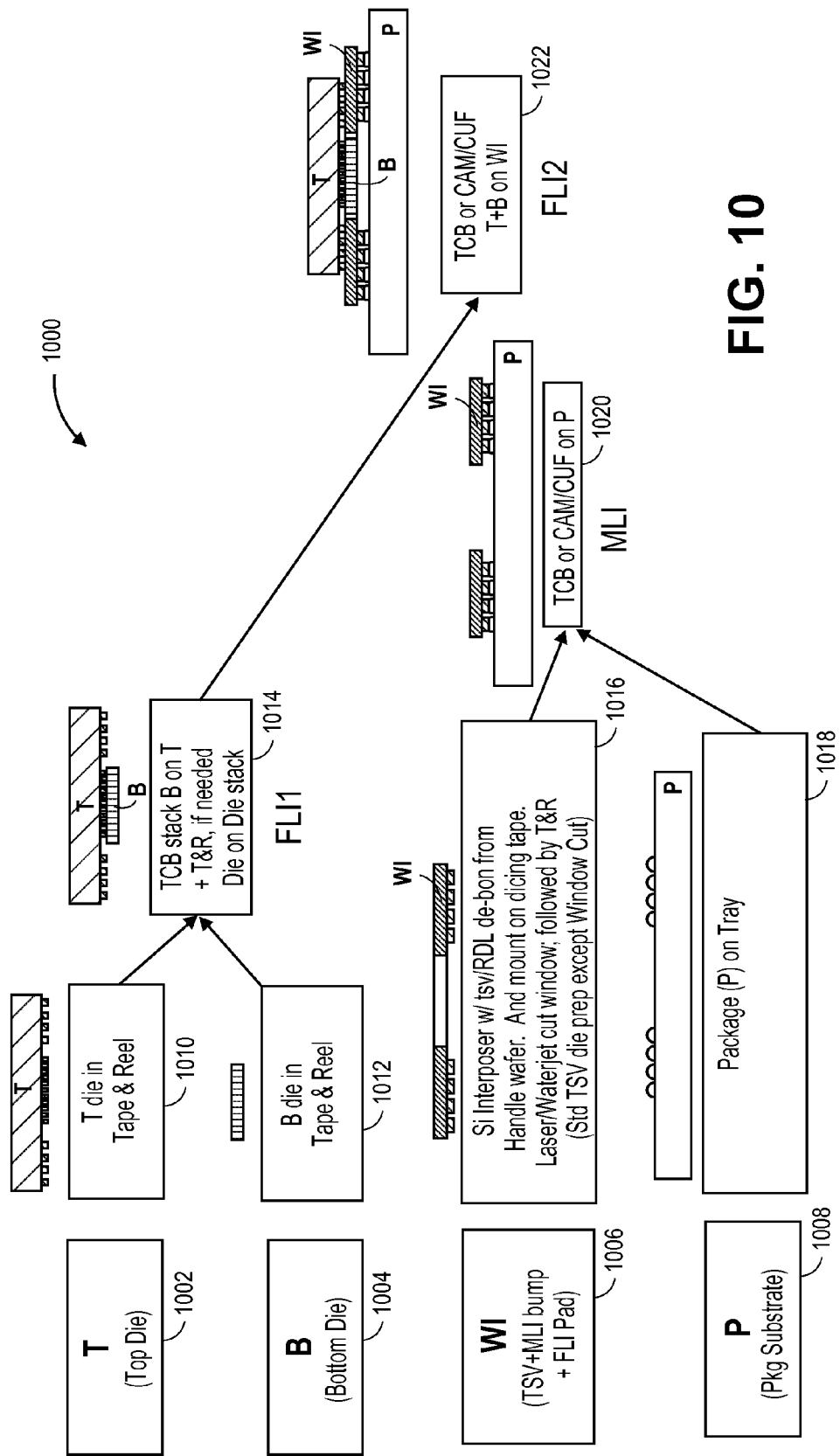
FIG. 10 illustrates a process flow for another method of fabricating a 3D integrated circuit package with a window interposer, in accordance with another embodiment of the present invention.

In a second example, FIG. 10 illustrates a process flow 1000 for another method of fabricating a 3D integrated circuit package with a window interposer, in accordance with another embodiment of the present invention.

Referring to process flow 1000 of FIG. 10, a top die 1002 portion of the flow includes providing a top die in a tape and reel format 1010. A bottom die 1004 portion of the flow includes providing a bottom die in a tape and reel format 1012. Thermal compression bonding (TCB) is then used to stack the bottom die on the top die 1014. A window interposer 1006 portion of the flow may include providing an interposer with a window and, possibly with TSVs, mid-level interconnect (MLI) bumps and first level interconnect (FLI) pads. In 1016, an interposer (such as a silicon interposer) with TSV and re-distribution layer (RDL) is de-bonded from a handling wafer and mounted on dicing tape. Laser and/or water jet cutting may be used to provide a window. A package substrate 1008 portion of flow includes providing a package substrate, e.g., on a tray as in 1018. In 1020, the window interposer from 1016 is bonded (e.g., by TCB or CAM/CUF) with the substrate. In 1022, the stack from 1014 is bonded with the interposer/substrate combination (from 1020), e.g., by TCB or CAM and/or CUF. Thus, referring again to process flow 1000, MLI is formed first. It is to be understood that the bottom die may or may not have MLI bumps. Additionally, the window interposer may be composed of multiple pieces. Also, additional die may be included in the pairing.

Many other options may be used to assemble and WIP die pairings with window interposers for packaging. Optimum options may depend on desired dimensional features such as relative die sizes for stack, overhang size, process reuse, etc.

With respect to at least some of the embodiments described herein, top die thermal management includes the use of features such as, but not limited to, a heat sink or an integrated heat spreader (HIS) attached directly to the back of the top die. Embodiments described herein may enable 3D IC packaging without requiring TSV in the active die. Furthermore, traditional benefits of a silicon interposer may be maintained.

In an embodiment, first level interconnect (FLI) pitch transformation to a looser mid-level interconnect (MLI) pitch is performed for lower cost packaging and assembly technology. In an embodiment, passives component (e.g., capacitors, resistors, or inductors) are designed into the interposer. In an embodiment, decoupling (i.e. protection) of active die interlayer dielectric (ILD) from package (e.g., MLI) driven stress is achieved. In an alternative embodiment, however, another active die with TSV and MLI bumps is used in place of the interposer.

In an embodiment, FLI bump pitch for the bottom die and window interposer is different, e.g., a finer pitch is used for bottom die/top die FLI (e.g., approximately 40 microns pitch) for high bandwidth and a looser pitch is used for window interposer/top die FLI (e.g., approximately 90 microns pitch) for expected larger area for the FLI. In one such embodiment, this approach creates a bimodal bump height distribution on the top die. However, the bimodal bump height distribution may be manageable as the bottom die and the window interposer are independently attached to the corresponding top die. In a specific such embodiment, solder on die for the top die or the bottom die/window interposer layer is used. In an embodiment, FLI underfill options include, but are not limited to, (a) WLUF on the top die, (b) window interposer and bottom die EF-TCB, (c) copper underfill (CUF), or (d) MUF.

One or more embodiments described herein may enable stacking various high bandwidth memory such as JEDEC Wide I/O memory, various other small devices under the CPU (or for that matter any other logic die). Furthermore, in an embodiment, use of the silicon interposer helps in reducing die size and package cost. In an embodiment, regarding incorporation of a silicon interposer, logic chips with I/O count growth due to memory bandwidth and/or due to new features such as in SoC are accommodated. If the logic die size remains small for lower cost, higher I/O bump density may be needed, requiring finer bump pitch and finer features (e.g., line/space/via, etc.) on the package substrate, driving higher package cost. By using a silicon interposer, in an embodiment, lower product cost is achieved by enabling die shrinks and lower cost coarse feature substrates.

One or more embodiments of the present invention provide 3D IC stacking such as low cost CPU and memory stacking to meet high product performance at low power. In an embodiment, stacking of a CPU and eDRAM without TSV on active die is enabled and aids in achieving lower cost. In an embodiment, a silicon interposer is used to manage high I/O density on a logic die. Similarly, embodiments may be targeted at 3D IC stacking work to add memory on CPU/GPU. In an embodiment, an interposer is combined with a 3D IC in a cost effective way and enabled 3D stacking of active die using a silicon interposer without having TSV in an active die.

Figure 11:
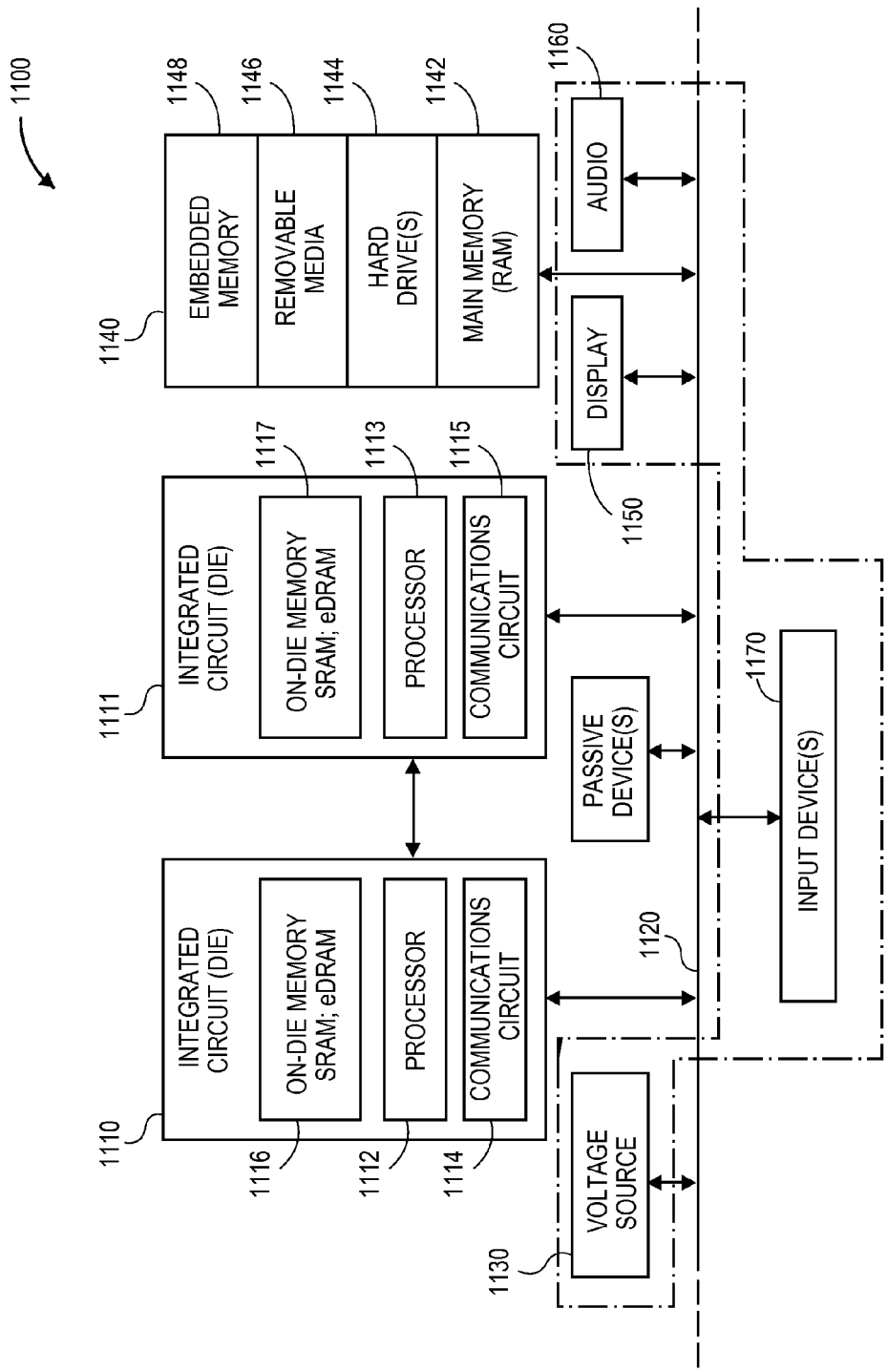
FIG. 11 is a schematic of a computer system, in accordance with an embodiment of the present invention.

FIG. 11 is a schematic of a computer system 1100, in accordance with an embodiment of the present invention. The computer system 1100 (also referred to as the electronic system 1100) as depicted can embody a 3D integrated circuit packages with a window interposer according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 is a 3D integrated circuit package with a window interposer disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems. In an embodiment, the processor 1110 includes on-die memory 1116 such as static random-access memory (SRAM). In an embodiment, the processor 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as a in a 3D integrated circuit package with a window interposer, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a 3D integrated circuit package with a window interposer according to any of the several disclosed embodiments and their equivalents, an electronic system, a computer system, one or more methods of fabricating an integrated circuit, and one or more methods of fabricating an electronic assembly that includes a 3D integrated circuit package with a window interposer according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed 3D integrated circuit package with a window interposer embodiments and their equivalents.

Thus, 3D integrated circuit packages with window interposers and methods to form such semiconductor packages have been disclosed. In an embodiment, a semiconductor package includes a substrate. A top semiconductor die is disposed above the substrate. An interposer having a window is disposed between and interconnected to the substrate and the top semiconductor die. A bottom semiconductor die is disposed in the window of the interposer and interconnected to the top semiconductor die. In another embodiment, a semiconductor package includes a substrate. A top semiconductor die is disposed above the substrate. An interposer is disposed between and interconnected to the substrate and the top semiconductor die. A bottom semiconductor die is disposed in a same plane as the interposer and interconnected to the top semiconductor die.

What is claimed is:
1. A semiconductor package, comprising:
a substrate;
a top semiconductor die disposed above the substrate, wherein the semiconductor package does not include an encapsulate laterally adjacent to the top semiconductor die;
an interposer having a window, the interposer disposed between and interconnected to the substrate and the top semiconductor die but not disposed laterally adjacent to the top semiconductor die, wherein vertical electrical paths of the interposer are exposed at both upper and lower surfaces of the interposer; and a bottom semiconductor die disposed in the window of the interposer laterally adjacent to the interposer, and interconnected to the top semiconductor die.

2. The semiconductor package of claim 1, wherein the bottom semiconductor die comprises no through silicon vias (TSVs) and is not interconnected directly to the substrate.

3. The semiconductor package of claim 1, wherein an active side of the bottom semiconductor die faces an active side of the top semiconductor die, and away from the substrate.

4. The semiconductor package of claim 1, wherein the bottom semiconductor die comprises through silicon vias (TSVs) and is interconnected directly to the substrate.

5. The semiconductor package of claim 1, wherein an active side of the bottom semiconductor die faces away from an active side of the top semiconductor die, and toward the substrate.

6. The semiconductor package of claim 1, wherein the bottom semiconductor die is disposed in a closed window of the interposer.

7. The semiconductor package of claim 6, wherein the top semiconductor die completely overlaps the bottom semiconductor die.

8. The semiconductor package of claim 6, further comprising one or more additional bottom semiconductor die, the one or more additional bottom semiconductor dies disposed in one or more additional closed windows of the interposer.

9. The semiconductor package of claim 8, wherein the top semiconductor die completely overlaps the bottom semiconductor die as well as the one or more additional bottom semiconductor dies.

10. The semiconductor package of claim 1, wherein the bottom semiconductor die is disposed in an open window of the interposer.

11. The semiconductor package of claim 10, wherein the top semiconductor die only partially overlaps the bottom semiconductor die.

12. The semiconductor package of claim 1, further comprising one or more additional top semiconductor dies, the one or more additional top semiconductor dies disposed above the substrate in a same plane as the top semiconductor die and interconnected to the interposer.

13. The semiconductor package of claim 12, wherein the top semiconductor die completely overlaps the bottom semiconductor die.

14. The semiconductor package of claim 1, wherein the interposer comprises two or more discrete units, and wherein the bottom semiconductor die is disposed in a closed window of the two or more discrete units of the interposer.

15. The semiconductor package of claim 14, wherein the top semiconductor die completely overlaps the bottom semiconductor die.

16. A semiconductor package, comprising:
   a substrate;
   a top semiconductor die disposed above the substrate, wherein the semiconductor package does not include an encapsulate laterally adjacent to the top semiconductor die;
   an interposer disposed between and interconnected to the substrate and the top semiconductor die but not disposed laterally adjacent to the top semiconductor die, wherein vertical electrical paths of the interposer are exposed at both upper and lower surfaces of the interposer; and
   a bottom semiconductor die disposed laterally adjacent to the interposer, and interconnected to the top semiconductor die.

17. The semiconductor package of claim 16, wherein the bottom semiconductor die is disposed laterally adjacent to, but not within, the interposer.

18. The semiconductor package of claim 16, wherein the top semiconductor die only partially overlaps the bottom semiconductor die.

19. The semiconductor package of claim 16, wherein the bottom semiconductor die comprises no through silicon vias (TSVs) and is not interconnected directly to the substrate.

20. The semiconductor package of claim 16, wherein an active side of the bottom semiconductor die faces an active side of the top semiconductor die, and away from the substrate.

21. The semiconductor package of claim 16, wherein the bottom semiconductor die comprises through silicon vias (TSVs) and is interconnected directly to the substrate.

22. The semiconductor package of claim 16, wherein an active side of the bottom semiconductor die faces away from an active side of the top semiconductor die, and toward the substrate.

* * * * *